US009286263B1

(12) United States Patent
Collins et al.

(10) Patent No.: US 9,286,263 B1
(45) Date of Patent: Mar. 15, 2016

(54) SYSTEM AND METHOD FOR PROVIDING INFORMATION REGARDING POSTS ON SOCIAL NETWORKING SITES

(75) Inventors: Alexander Collins, San Francisco, CA (US); Jeffrey L. Korn, New York, NY (US)

(73) Assignee: Google Inc., Mountain View, CA (US)

( * ) Notice: Subject to any disclaimer, the term of this patent is extended or adjusted under 35 U.S.C. 154(b) by 273 days.

(21) Appl. No.: 13/548,038

(22) Filed: Jul. 12, 2012

(51) Int. Cl.
| | |
|---|---|
| *G06F 17/00* | (2006.01) |
| *H01L 21/285* | (2006.01) |
| *H04L 29/08* | (2006.01) |
| *G06F 17/18* | (2006.01) |
| *G06F 17/30* | (2006.01) |
| *G06F 3/01* | (2006.01) |
| *G06N 5/04* | (2006.01) |
| *G06Q 50/00* | (2012.01) |

(52) U.S. Cl.
CPC .............. *G06F 17/00* (2013.01); *G06F 3/016* (2013.01); *G06F 17/18* (2013.01); *G06F 17/3053* (2013.01); *G06N 5/04* (2013.01); *G06Q 50/01* (2013.01); *H01L 21/28518* (2013.01); *H04L 67/22* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,080,139 | B1 * | 7/2006 | Briggs et al. | 709/224 |
| 8,166,061 | B2 * | 4/2012 | Armstrong et al. | 707/769 |
| 2009/0234876 | A1 * | 9/2009 | Schigel et al. | 707/102 |
| 2010/0024042 | A1 * | 1/2010 | Motahari et al. | 726/26 |
| 2010/0042910 | A1 * | 2/2010 | Manolescu et al. | 715/202 |
| 2011/0196855 | A1 * | 8/2011 | Wable et al. | 707/711 |
| 2013/0325745 | A1 * | 12/2013 | Kelly et al. | 705/347 |

* cited by examiner

*Primary Examiner* — Chris Parry
*Assistant Examiner* — Caroline Jahnige
(74) *Attorney, Agent, or Firm* — McDermott Will & Emery LLP

(57) ABSTRACT

A system and method is disclosed for providing information regarding posts on social networking sites. The system receives, using one or more computing devices, an identifier for a content item to post in a message of a user on a social networking site, where the identifier is received before a request to post the message. The system also identifies, using the one or more computing devices and based on the received identifier, one or more messages including the content item previously posted on the social networking site. The system also provides for display to the user, using the one or more computing devices, information about the one or more messages including the content item previously posted on the social networking site to the user, where the information is provided for display before the request to post the message is received.

27 Claims, 6 Drawing Sheets

SYSTEM AND METHOD FOR PROVIDING INFORMATION REGARDING POSTS ON SOCIAL NETWORKING SITES

BACKGROUND

The subject technology generally relates to providing information regarding posts, and in particular, relates to providing information regarding posts on social networking sites.

Social network users often post content items (e.g., links to interesting sites/articles, images, videos, etc.) that they think their friends would like on their social networking accounts. However, many users are intimidated about posting these links because they feel they may be spamming their friends if they have already seen the link. This may discourage a user from posting a link that they feel others may have already posted or seen.

SUMMARY

According to one aspect of the subject technology, a computer-implemented method for providing information regarding posts on social networking sites is provided. The method comprises receiving, using one or more computing devices, an identifier for a content item to post in a message of a user on a social networking site, wherein the identifier is received before a request to post the message. The method further comprises identifying, using the one or more computing devices and based on the received identifier, one or more messages including the content item previously posted on the social networking site. The method further comprises providing for display to the user, using the one or more computing devices, information about the one or more messages including the content item previously posted on the social networking site, wherein the information is provided for display before the request to post the message is received.

According to another aspect of the subject technology, a system for providing information regarding posts on social networking sites is provided. The system comprises one or more processors, and a machine-readable medium comprising instructions stored therein, which when executed by the processors, cause the processors to perform operations comprising receiving, using one or more computing devices, an identifier for a content item to post in a message of a user on a social networking site, wherein the identifier is received before a request to post the message. The operations further comprise identifying, using the one or more computing devices and based on the received identifier, one or more messages including the content item previously posted on the social networking site, wherein identifying the one or more messages comprises identifying one or more messages including the content item that were previously posted by one or more contacts associated with the user. The operations further comprise generating a listing of names of the one or more contacts associated with the user. The operations further comprise providing for display to the user, using the one or more computing devices, information about the one or more messages containing the content item previously posted on the social networking site, wherein the information is provided for display before the request to post the message is received, and wherein the information is provided for display before the request to post the message is received.

According to another aspect of the subject technology, a machine readable medium for providing information regarding posts on social networking sites is provided. The machine readable medium comprising instructions stored therein, which when executed by a processor, cause the processor to perform operations comprising receiving, using one or more computing devices, an identifier for a content item to post in a message of a user on a social networking site, wherein the identifier is received before a request to post the message. The operations further comprise identifying, using the one or more computing devices and based on the received identifier, one or more messages including the content item previously posted on the social networking site, wherein identifying the one or more messages comprises identifying one or more messages including the content item that were previously posted into activity streams of one or more contacts associated with the user. The operations further comprise determining if the one or more previously posted messages are visible to the user. The operations further comprise providing for display to the user, using the one or more computing devices, information about the one or more previously posted messages, wherein the provided information comprises information about the one or more messages including the content item previously posted on the social networking site that are determined to be visible to the user, and wherein the information is provided for display before the request to post the message is received.

Additional features and advantages of the subject technology will be set forth in the description below, and in part will be apparent from the description, or may be learned by practice of the subject technology. The advantages of the subject technology will be realized and attained by the structure particularly pointed out in the written description and claims hereof as well as the appended drawings.

It is to be understood that both the foregoing general description and the following detailed description are exemplary and explanatory and are intended to provide further explanation of the subject technology as claimed.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology. In the drawings.

DETAILED DESCRIPTION

Figure 1:
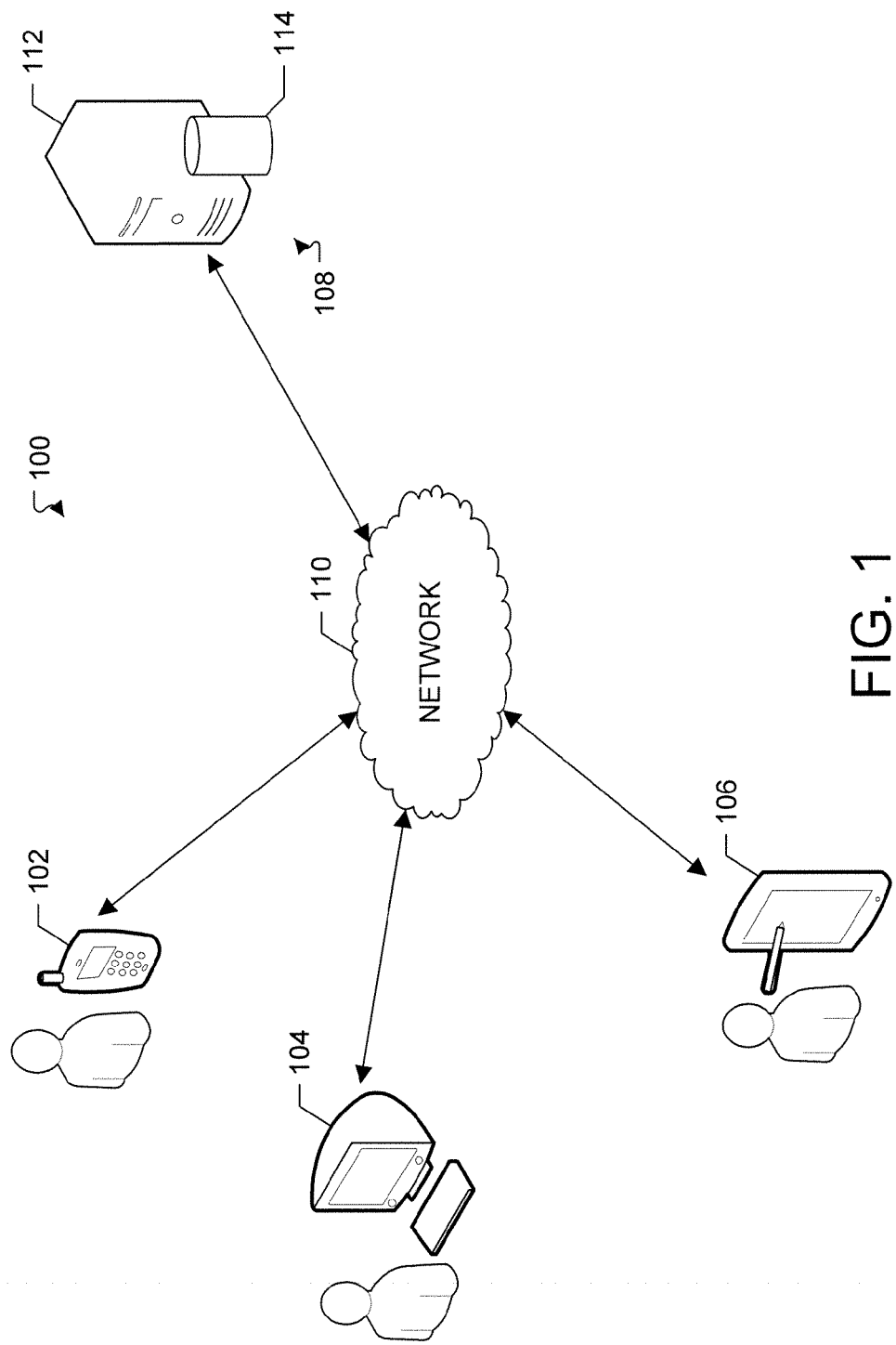
FIG. 1 illustrates an example distributed network environment for providing information regarding posts on social networking sites.

The detailed description set forth below is intended as a description of various configurations of the subject technology and is not intended to represent the only configurations in which the subject technology may be practiced. It will be apparent, however, that the subject technology is not limited to the specific details set forth herein and may be practiced without these specific details. In some instances, well-known structures and components are shown in block diagram form in order to avoid obscuring the concepts of the subject technology.

In accordance with the subject disclosure, a system and method for providing a user with information regarding posts on a social networking site are provided. The system has access to posts on the social networking site including posts by contacts associated with the user and/or posts posted into activity streams of contacts associated with the user. Contacts associated with the user may include contacts in the user's social graph, contacts associated with contacts in the user's social graph, contacts within a subgroup (e.g., family members, co-workers, classmates, etc.) of the user's social graph, etc. An application (e.g., a web browsing application, an electronic messaging application etc.) running on an electronic device (e.g., a desktop computer, a laptop computer, a smartphone device etc.) may provide a user interface for posting on a social networking website. When the user includes a content item attached to or embedded within the text of a user post, an identifier is provided to the system. The identifier may be automatically provided to the system in response to a user input of the content item. Alternatively, the user may enter the content item in an input field of a user interface and select a user selectable control (e.g., a button) to initiate a check for previous posts containing the content item. In one example, the identifier of the content item is selected by the user and provided to the system. Where the user interface provides a user selectable control to initiate a check for previous posts containing the item, the identifier is provided to the system in response to a user action with respect to the user selectable control.

The system receives the identifier (e.g., a uniform resource locator) for the content item before a user post containing the content item is posted on the social networking site. The system may automatically receive the identifier for the content item in response to a user input of the content item (e.g., a user input of a uniform resource locator into a user input box) and provide information regarding sharing statistics of the content item to the user. Alternatively, where the user interface includes a user selectable control (e.g., a button) configured to initiate a check for previous posts containing the content item by contacts associated with the user, the system may receive the identifier for the content item in response to a user action (e.g., a click action, a tap action, a hover action, etc.) with respect to the user selectable control.

The system identifies, based on the received identifier, one or more messages including the content item that were previously posted on the social networking site. The system may identify one or more messages including the content item posted by contacts associated with the user. In one example, the system uses the user's social graph of contracts for searching prior posts made to the social network. The prior posts may be indexed and a search of the index can be made using the user's contacts and the identifier for the content item. Where the identifier is a uniform resource locator, the system may traverse through the index of prior posts by contacts associated with the user for one or more posts that include the uniform resource locator. In another example, the system first traverses through prior messages by all of the social networking site's users for prior posts that include the content item. The system then traverses through the prior posts that include the content item for posts by contacts associated with the user. The system may use other algorithms to obtain prior posts by contacts associated with the user that include the content item.

The system may also identify one or more messages including the content item that were previously posted into activity streams of contacts associated with the user. In one example, the system has access to a listing of content items that were previously posted into social network user activity streams. The system may traverse the listing for contacts associated with the user that previously received the content item in their user activity streams. Where the identifier is a uniform resource locator, the system may traverse the database for content identified by the uniform resource locator that were provided for display in user activity streams of contacts associated with the user.

The system may provide information regarding all prior posts including the content item by contacts associated with the user and/or prior posts including the content items that were previously posted on the activity streams of contacts associated with the user. Alternatively, the system may determine to provide information regarding less than all of the prior posts that include the content item by contacts associated with the user if at least one of the prior posts is not accessible to the user (e.g., invisible to the user). Similarly, the system may determine not to provide all information regarding prior displayed posts including the content items. In one example, information regarding all prior posts by contacts associated with the user that include the content item are provided. In another example, information regarding only prior visible posts by contacts associated with the user that include the content item are provided to the user.

The system provides the user with information regarding the content item (e.g., how many users have posted the content item and their identities). The provided information may include a listing of names of at least one of the users associated with one or more of the previous posts that include the content item. The provided information may also include a total number of prior posts that include the content item. In one example, a listing that includes the number of contacts associated with the user that posted messages containing the content item and/or names of one or more contacts associated with the user that posted messages containing the content item may be provided to the user. In another example, a listing that includes the number of contacts associated with the user that received posted messages containing the content item on their social network activity streams may be provided to the user. The listing may also include names of the users that received the posted messages containing the content item on their activity streams.

A user interface may be provided to the user displaying a message such as "you are the first of your friends circle to post this content item," "the content item has not been posted into the activity stream of anyone in your friends circle," "you are the first of your extended network to post this content item," "10 other people in your circles/extended network have posted this content item," "the content item was previously posted into activity streams of 10 other people in your circles/extended network," etc.

In one example, the system shares information regarding one or more posts by one or more contacts associated with the user that are invisible to the user. In this instance, to ensure the privacy of those users posting the content item, the system provides such information to the user when it is determined the ratio of the number of users who have posted the content item to the total number of contacts that are associated with the user is below a threshold. This threshold represents a likelihood that the user would be able to guess the users that actually posted.

The system provides information regarding prior posts by one or more contacts associated with the user that includes the content item before the user post which includes the content item is posted onto the social networking site. The system may provide the information regarding the prior posts for display on a separate user interface (e.g., a window, a pop up, etc.) from the user interface containing the user post. Alternatively, the user post containing the content item and the provided information regarding prior posts may be provided on a single interface. The user may consider the provided information regarding prior posts by contacts associated with the user that contain the content item and decide whether to post the user message.

FIG. 1 illustrates an example network environment for providing information regarding posts on social networking sites. Network environment 100 includes a number of electronic devices 102, 104, and 106 communicably connected to a server 108 by a network 110. Server 108 includes a processing device 112 and a data store 114. Processing device 112 executes computer instructions stored in a computer-readable medium, for example, to search for prior social network posts by contacts associated with the user that contain the content item. Data store 114, stores social network posts by the social network's users.

Server 108 may be any system or device having a processor, memory, and communications capability for providing messaging recommendations for electronic messaging. Server 108 may be a single computing device such as a computer server. Server 108 may also represent more than one computing device working together to perform the actions of a server computer.

In some example aspects, each of the electronic devices 102, 104, and 106 include any machine with hardware and software to receive information regarding posts on social networking sites from server 108 and to provide the received information for display. Each of the electronic devices 102, 104, and 106 may also transmit one or more user posts to server 108. Electronic devices 102, 104, and 106 may be mobile devices (e.g., smartphone devices, tablet computers, PDAs, and laptop computers), portable media players, desktop computers, or other computing devices. In the example of FIG. 1, electronic device 102 is depicted as a smartphone device, electronic device 104 is depicted as a desktop computer, and electronic device 106 is depicted as a PDA.

One or more software applications (e.g., a web browsing application, an electronic messaging application, etc.) running on electronic device 102, 104 or 106 may provide a user interface for displaying information about one or more posts to one or more social network users. The one or more software applications may also provide an input box for receiving one or more user inputs (e.g., a social network post by the user including a content item, an identifier for the content item associated with the social network post, etc.) and a user selectable control (e.g., a tab, a button, etc.) that is configured to transmit the one or more user inputs to server 108 via network 110 in response to a user action (e.g., a swipe action, a click action, a hover action, etc.) with respect to the user selectable control.

Server 108 may receive, an identifier for a content item from electronic devices 102, 104, and 106 via the network 110. The identifier for the content item may be a uniform resource locator associated with the content item. Server may automatically receive the identifier for the content item in response to a user input of the content item into a input box of a user interface that is provided by an application (e.g., a web browsing application, an electronic messaging application, etc) running on an electronic device 102, 104, or 106. Alternatively, if the user interface provides a user selectable control (e.g., a button) that is configured to initiate a check for previous posts containing the content item in response to a user action (e.g., a click action), the user may enter the content item into the input box and select the user selectable control to initiate a check for previous posts containing the content item.

Server 108 contains information regarding one or more social network users. Information regarding the one or more social network users may include contacts associated to the one or more social network users (e.g., a user's social graph, contacts associated with contacts in a user's social graph, contacts that are subscribed to the user, etc.). Server 108 may store social network posts by social network users, including contacts associated with the user. Server 108 may also store social network posts posted into activity streams of social network users, including contacts associated with the user. The social network posts may be indexed based on posting users and/or unique identifiers of content items contained in the posts.

Server 108 may identify, based on the received identifier, whether one or more messages including the content item were previously posted on the social networking site. The one or more messages including the content item may be posted by contacts associated with the user. Where the social network posts are indexed based on unique identifiers that are contained in the social network posts, server 108 may search the index of content items for posts by contacts associated with the user that contain the received identifier. For example, where the identifier is a uniform resource locator, server 108 searches the index of content items for one or more posts by contacts associated with the user that contain the received uniform resource locator.

The one or more messages including the content item may also include messages that were previously posted into activity streams of contacts associated with the user. Server 108 may maintain a listing of contacts associated with the user that previously received the content item in their user activity streams. Where the identifier is a uniform resource locator, server 108 may traverse the listing for one or more posts containing the uniform resource locator that were previously displayed on user activity streams of contacts associated with the user. Server 108 may periodically update the listing to maintain the listing's accuracy.

Server 108 may generate information about the messages including the content item that was previously posted by contacts associated with the user and/or previously posted into activity streams of contacts associated with the user. In one example, server 108 may generate a listing of names of the contacts associated with user who had previously posted messages including the content item. In another example, server 108 may generate a listing of names of the contacts associated with the user that previously received the messages including the content item on their activity streams.

Server 108 may also determine if any of the previously posted messages is not visible to the user. Where at least one of the previously posted messages is not visible to the user, server 108 may calculate a ratio of a total number of contacts associated with the user that previously posted the messages to a total number of contacts associated with the user. Server 108 may compare the ratio with a threshold value, and based on the ratio, exclude information about the previously posted messages that are not visible to the user.

Server 108 may provide information about the one or more previously posted messages for display to any of the electronic devices 102, 104, and 106. The provided information about the one or more previously posted messages are displayed on the user interface before the user message that includes the content item is provided to the social networking site. The provided information may also include names of the contacts that posted the one or more previously posted messages. Server 108 may also provide names of the users who previously posted one or more messages that are visible to the user but exclude names of one or more users that posted the one or more messages that are not visible to the user. Where the ratio is less than the threshold value, the provided information may include a numerical value that represents a total number of messages including the content item previously posted by contacts associated with the user. Alternatively, the provided information may exclude any information about the one or more previously posted messages that are not visible to the user if the ratio is greater than the threshold value.

The provided information is transmitted from server 108 to electronic devices 102, 104, and 106 via the network 110. Where one or more software applications (e.g., web browsing application, electronic messaging application, etc.) are running on the electronic device 102, 104, or 106, the one or more software applications may provide a user interface for displaying the provided information about the one or more previously posted messages.

Network 110 may include, for example, any one or more of a cellular network, a satellite network, a personal area network (PAN), a local area network (LAN), a wide area network (WAN), a broadband network (BBN), the Internet, and the like. Further, the network 110 can include, but is not limited to, any one or more of the following network topologies, including a bus network, a star network, a ring network, a mesh network, a star-bus network, tree or hierarchical network, and the like.

Figure 2:
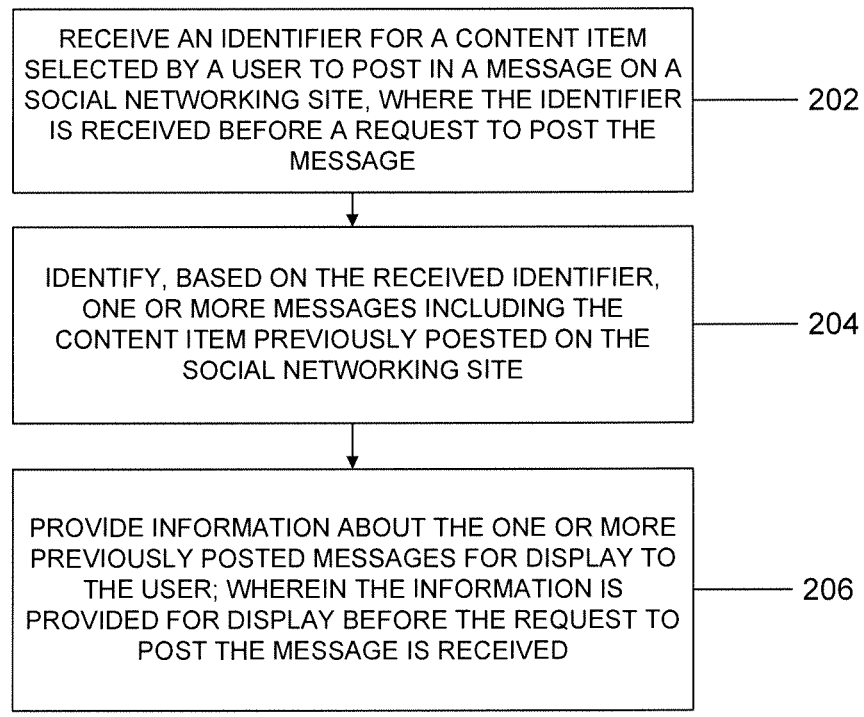
FIG. 2 illustrates an example process containing information regarding posts on social networking sites.

FIG. 2 illustrates an example process for providing information regarding posts on social networking sites. The process may be initiated when the user enters a content item into an input field of a user interface that is provided by an application (e.g., a web browsing application, an electronic messaging application, etc.) running on an electronic device 102, 104, or 106. An identifier (e.g., a uniform resource locator) of the content item may be automatically provided to server 108 in response to a user entry of the content item into the input field. In one example, the identifier of the content item is selected by the user and provided to server 108. Alternatively, the user interface may include a user selectable control (e.g., a button) configured to initiate a check for previous posts containing the content item, and the identifier is provided to the server 108 in response to a user action with respect to the button.

Server 108 receives an identifier for a content item to post in a message on a social networking site before a request to post the message in block 202. The identifier may include one or more uniform resource locators and may be transmitted from an electronic device 102, 104, or 106 to the server via the network.

In block 204, server 108 identifies, based on the received identifier, whether one or more messages including the content item were previously posted on the social networking site. The one or more messages may be messages posted by one or more contacts associated with the user and/or messages posted in activity streams of one or more contacts associated with the user. Previous messages by the social networking site users, including previous messages containing the content item by contacts associated with the user item may be stored on the server. Where the received identifier is a uniform resource locator, the server may determine whether the one or more messages including the content item has been posted by contacts associated with the user by comparing the received uniform resource locator with uniform resource locators of content items in messages previously posted on the social networking site. The server may also compare a domain of the received uniform resource locator with domains of uniform resource locators of content items in messages previously posted on the social networking site.

Contacts associated with the user may include contacts in the user's social graph. Contacts associated with the user may also include contacts associated with the contacts in the user's social graph. Contacts associated with the user may also include a specific subset of the user's social graph (e.g., family contacts, coworker contacts, classmate contacts, etc.). Contacts associated with the user may also include one or more contacts that are subscribed to the user.

Server 108 may generate information about the one or more messages that include the content item that were previously posted on the social networking site by contacts associated with the user. Server 108 may also generate information about the one or more messages including the content item that were previously posted in user activity streams of contacts associated with the user. The server may generate a listing of names of the one or more contacts associated with the user. The server may also generate a number that represents a total number of the one or more previously posted messages. The generated information may contain additional information related to the one or more previously posted messages that include the content item.

The server may determine if the user is restricted from accessing any of the one or more previously posted messages. In this regard, the server may determine whether the one or more previously posted messages are visible and/or not visible to the user. Where at least one of the one or more previously posted messages are not visible to the user, the server may calculate of a ratio of a total number of contacts associated with the user that posted the one or more previously posted messages to a total number of contacts associated with the user may also be made. The ratio may be compared to a threshold value to determine whether information regarding the one or more previously posted messages that are not visible to the user should be provided.

In block 206, information about the one or more previously posted messages are provided for display before the request to post the message is received. Information about the one or more messages including the content item that were previously posted to user activity streams of contacts associated with the user. The information may be provided for display on any electronic device 102, 104, and 106. Where a software application (e.g., a web browsing application, an electronic messaging application, etc.) is running on an electronic device 102, 104, or 106, the software application may provide a user interface for displaying the provided information. The provided information may include a total number of the one or more previously posted messages. The provided information may include names of contacts that posted the one or more previously posted messages. Where the ratio is less than the threshold, the provided information may include some information about the one or more previously posted messages that are not be visible to the user. For example, the total number of one or more previously posted messages that are both visible and not visible to the user may be provided to the user. However, the provided information may not include names of contacts that posted the one or more previously posted messages. Where the ratio is greater than the threshold, the provided information may exclude any information about the one or more previously posted messages that are not visible to the user.

Server 108 may receive the request to post the message containing the content item on the social networking site after the information about the one or more previously posted messages containing the content item is provided for display. In one example, the request may be initiated by the user and transmitted from electronic device 102, 104, or 106 to server 108. Server 108 then posts the message containing the content item on the social networking site. Server 108 elects to post the message containing the content item on the social networking site at least in part based on receiving the request to post the message containing the content item on the social networking site.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Figure 3A:
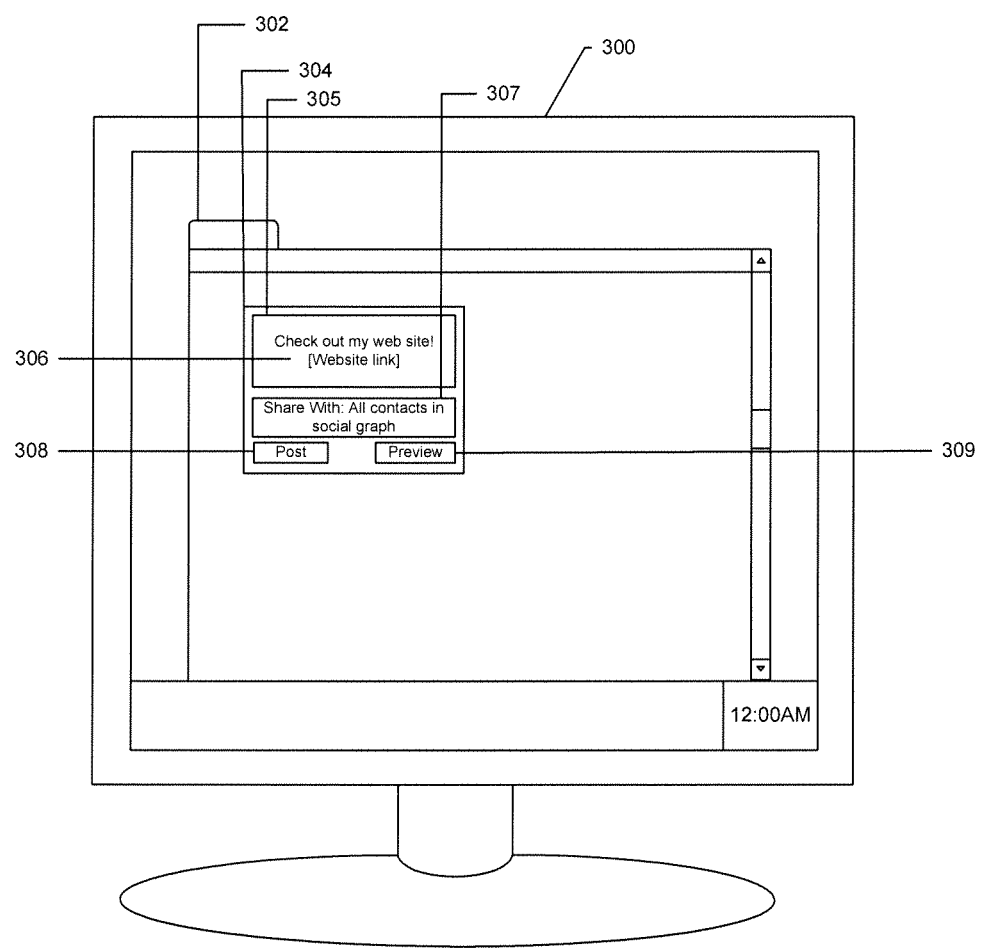
FIG. 3A illustrates an example user interface for posting a content item onto a social networking site.

FIG. 3A illustrates an example user interface for posting a content item onto a social networking site. FIG. 3A depicts a web browsing application 302 running on a desktop electronic device 300 that provides a user interface for postings messages including one or more content items onto the social networking site. A different software application (e.g., a electronic messaging application etc.) running on a different type of electronic device (e.g., a laptop computer, a tablet computer, etc) may also provide a user interface (e.g., a window, a panel, a pop up, etc) for posting one or more content items onto the social networking site.

The user interface as shown in FIG. 3A displays an interactive element 304 for posting a message. The interactive element 304 for posting a message includes a first user input box 305 that is configured to receive a content item 306 in addition to a user post. The interactive element 304 as shown in FIG. 3A also contains a second user input box 307 that is configured to receive a user designation of one or more contacts associated with the user that the user wishes to share the user post with. For example, the user may designate the user message including the content item to appear to users within the user's social graph, users associated with users within the user's social graph, a specific group of users within the user's social graph (e.g., family members, co-workers, classmates), etc. The interactive element 304 as shown in FIG. 3A includes a first user selectable control 308 ("post button") configured to provide the social networking site with the user post and a second user selectable control 309 ("preview") configured to initiate a check for previous posts containing the content item in response to a user action (e.g., a click action, a swipe action, a hover action etc.) with respect to the respective user selectable control 308 or 309. Additional interactive elements may include one or more input boxes for receiving a content item. Additional interactive elements may include one or more user selectable controls that are configured to provide the social networking site's server with an identifier of the user inputted content item in response to a user action with respect to the one or more user selectable controls.

Figure 3B:
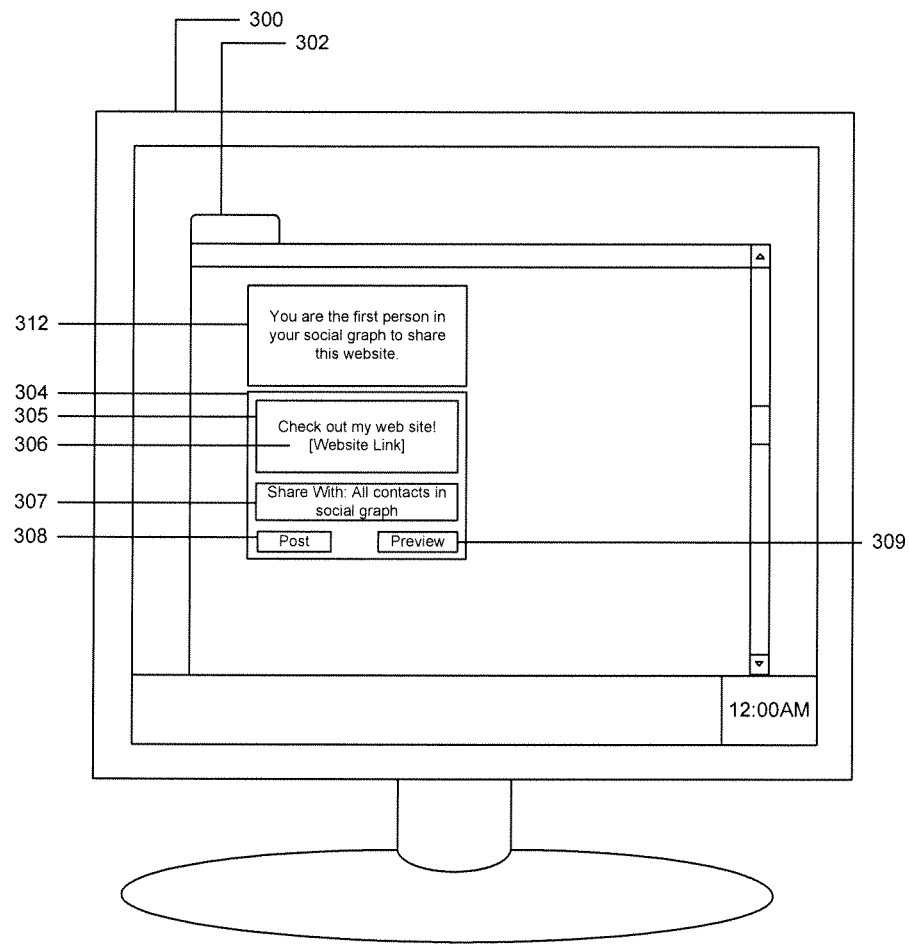
FIG. 3B illustrates a first example of the user interface of FIG. 3A for providing, in response to a user input of a content item, a notification of prior posts that includes the content item by contacts associated with a user.

FIG. 3B illustrates a first example of the user interface of FIG. 3A for providing, in response to a user input of a content item, a notification of prior posts that includes the content item by contacts associated with a user. The user interface as shown in FIG. 3B provides a notification 312 informing the user that the user is the first person in the user's social graph to post the content item 306. Additional notifications may include additional information about the content item 306 and/or one or more contacts associated with the user that has posted the content item. Furthermore, the notification 312 and the interactive element 304 for posting a message may be provided by separate user interfaces.

The notification 312 may be generated in response to a user action (e.g., a click action, a swipe action, a hover action etc.) with respect to the preview button 309. Alternatively, an identifier for the content item 306 may be automatically generated and provided to the social networking site's server in response to a user input of the content item 306 into the first user input box 305. Where the identifier is automatically sent to the social networking site's server, notification 312 may be automatically generated and provided for display on the user interface in response a user input of the content item 306 into the first user input box 305. The notification 312 as shown in FIG. 3B is displayed above the interactive element 304 for posting user messages. Additional user interfaces may display the notification 312 at another location with respect to the user interface.

Figure 3C:
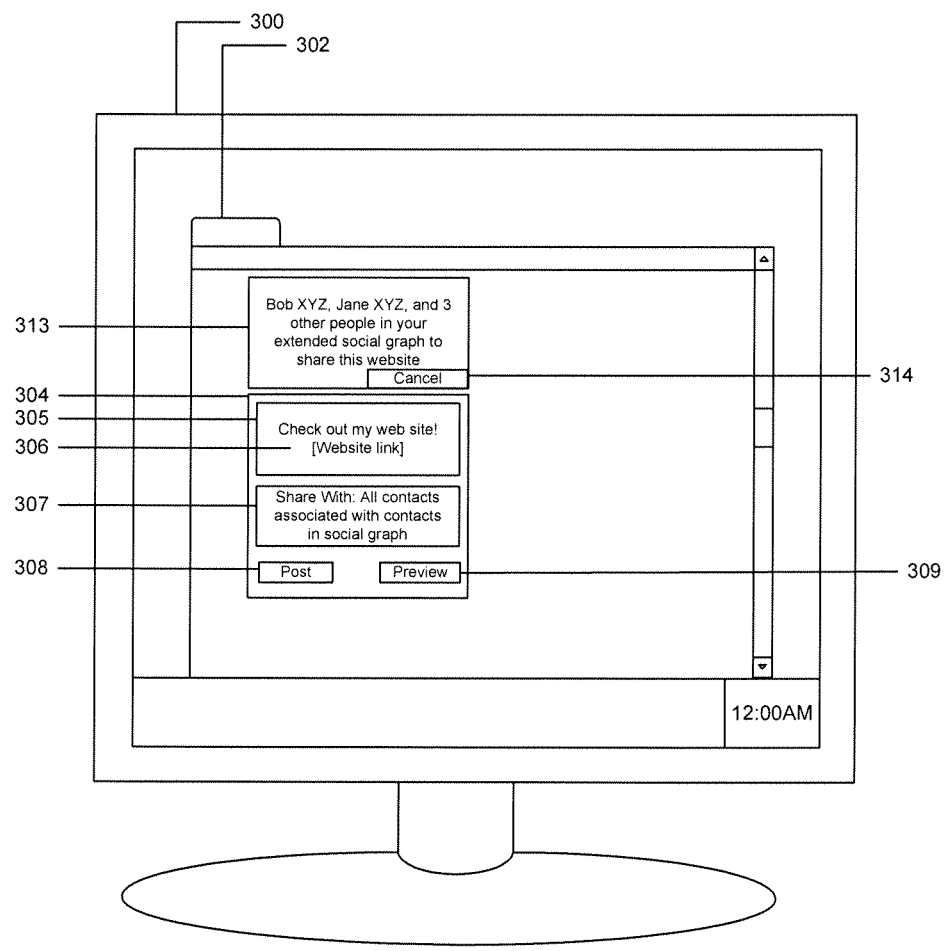
FIG. 3C illustrates a second example of the user interface of FIG. 3A for providing, in response to a user input of a content item, a notification of prior posts that includes the content item by contacts associated with a user.

FIG. 3C illustrates a second example of the user interface of FIG. 3A for providing, in response to a user input of a content item, a notification of prior posts that includes the content item by contacts associated with a user. The user interface as shown in FIG. 3C provides a notification 313 that includes names of contacts within the user's extended social graph that and a number of additional contacts within the user's extended social graph that have posted the content item 306. The notification 313 and the interactive element for posting a message may be provided by separate user interfaces. Additional notifications may include additional information about the content item 306 and/or one or more contacts associated with the user that have posted the content item. The amount of additional information that are provided to the user may be based on whether the user is prohibited to view one or more posts by contacts associated with the user that contain the content item. For example, where the user is prohibited from viewing a post by a contact associated with the user that includes the content item, the name of the source of the post is not provided in the notification.

The notification 313 may be generated in response to a user action (e.g., a click action, a swipe action, a hover action etc.) with respect to the preview button 309. Alternatively, an identifier for the content item 306 may be automatically sent to the social networking site's server in response to a user input of the content item 306 into the first user input box 305. Where the identifier is automatically sent to the social networking site's server, notification 313 may be automatically generated and provided for display on the user interface in response a user input of the content item 306 into the first user input box 305. The notification 313 as shown in FIG. 3C is displayed above the interactive element 304 for posting user messages. Additional user interfaces may display the notification 313 at another location with respect to the user interface. The notification 313 as shown in FIG. 3C includes a third user selectable control for responding to the notification 314 (e.g., a "cancel" button). The cancel button 314 is configured to remove the user post 305 including the content item 306 from the interactive element 304 for posting user messages. Additional user interfaces may display the notification 313 at another location with respect to the user interface.

Figure 4:
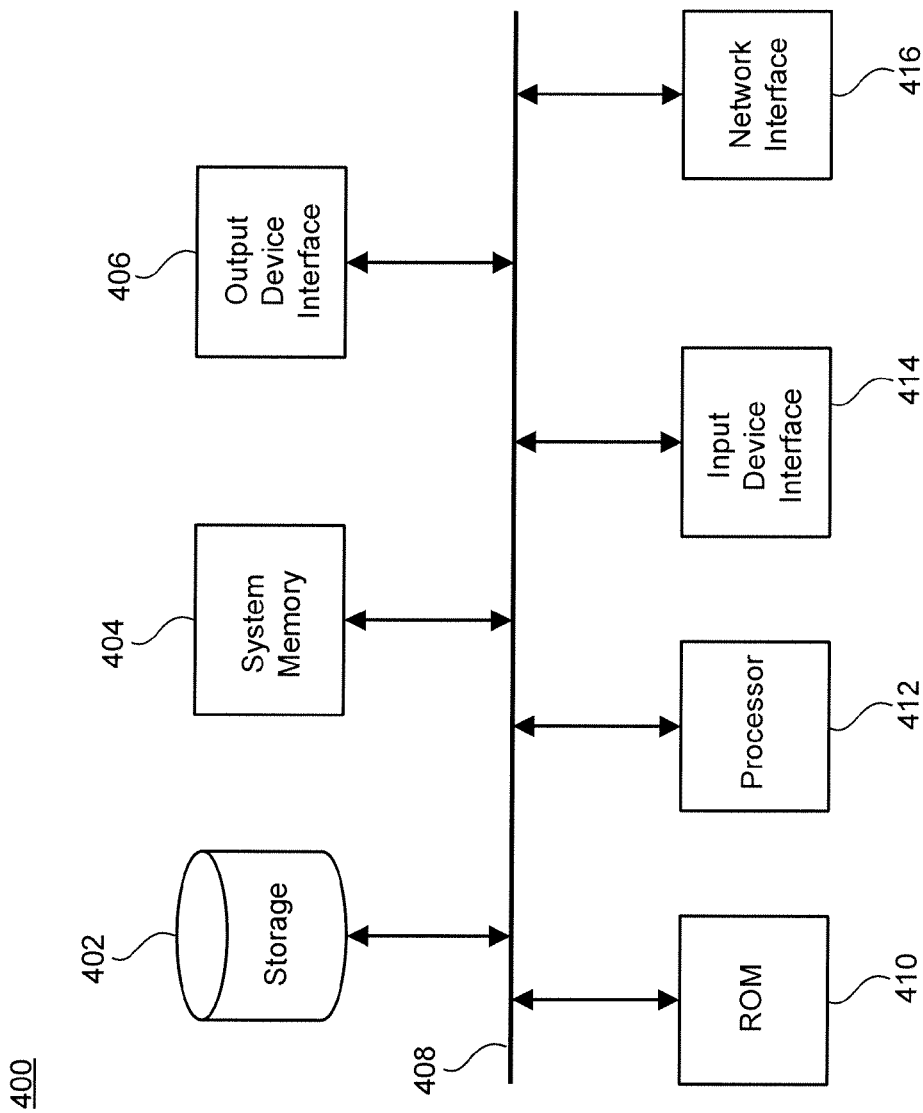
FIG. 4 conceptually illustrates an electronic system with which some implementations of the subject technology are implemented.

FIG. 4 conceptually illustrates an electronic system with which some implementations of the subject technology are implemented. In certain aspects, the computer system 400 may be implemented using hardware or a combination of software and hardware, either in a dedicated server, or integrated into another entity, or distributed across multiple entities.

Computer system 400 (e.g., electronic device 102, 104, and 106 and server 108) includes a bus 408 or other communication mechanism for communicating information, and a processor 402 coupled with bus 408 for processing information. By way of example, the computer system 400 may be implemented with one or more processors 402. Processor 402 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information.

Computer system 400 can include, in addition to hardware, code that creates an execution environment for the computer program in question, e.g., code that constitutes processor firmware, a protocol stack, a database management system, an operating system, or a combination of one or more of them stored in an included memory 404, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 408 for storing information and instructions to be executed by processor 402. The processor 402 and the memory 404 can be supplemented by, or incorporated in, special purpose logic circuitry.

The instructions may be stored in the memory 404 and implemented in one or more computer program products, i.e., one or more modules of computer program instructions encoded on a computer readable medium for execution by, or to control the operation of, the computer system 400, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, offside rule languages, procedural languages, reflective languages, rule-based languages, scripting languages, stack-based languages, synchronous languages, syntax handling languages, visual languages, wirth languages, and xml-based languages. Memory 404 may also be used for storing temporary variable or other intermediate information during execution of instructions to be executed by processor 402.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 400 further includes a data storage device 406 such as a magnetic disk or optical disk, coupled to bus 408 for storing information and instructions. Computer system 400 may be coupled vian input/output module 410 to various devices. The input/output module 410 can be any input/output module. Exemplary input/output modules 410 include data ports such as USB ports. The input/output module 410 is configured to connect to a communications module 412. Exemplary communications modules 412 include networking interface cards, such as Ethernet cards and modems. In certain aspects, the input/output module 410 is configured to connect to a plurality of devices, such as an input device 414 and/or an output device 416. Exemplary input devices 414 include a keyboard and a pointing device, e.g., a mouse or a trackball, by which a user can provide input to the computer system 400. Other kinds of input devices 414 can be used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback; and input from the user can be received in any form, including acoustic, speech, tactile, or brain wave input. Exemplary output devices 416 include display devices, such as a CRT (cathode ray tube) or LCD (liquid crystal display) monitor, for displaying information to the user.

According to one aspect of the present disclosure, the electronic device 102, 104, and 106 and server 108 can be implemented using a computer system 400 in response to processor 402 executing one or more sequences of one or more instructions contained in memory 404. Such instructions may be read into memory 404 from another machine-readable medium, such as data storage device 406. Execution of the sequences of instructions contained in main memory 404 causes processor 402 to perform the process steps described herein. One or more processors in a multi-processing arrangement may also be employed to execute the sequences of instructions contained in memory 404. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a computer device having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network (e.g., network 110) can include, for example, any one or more of a personal area network (PAN), a local area network (LAN), a campus area network (CAN), a metropolitan area network (MAN), a wide area network (WAN), a broadband network (BBN), the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computing system 400 can include electronic devices 102, 104, and 106 and servers 108. A electronic device 102, 104, and 106 and server 108 are generally remote from each other and typically interact through a communication network. The relationship of the electronic device 102, 104, and 106 and server 108 arises by virtue of computer programs running on the respective computers and having a electronic device-server relationship to each other. Computer system 400 can be, for example, and without limitation, a touchscreen device, a desktop computer, laptop computer, or tablet computer. Computer system 400 can also be embedded in another device, for example, and without limitation, a mobile telephone, a personal digital assistant (PDA), a mobile audio player, a Global Positioning System (GPS) receiver, a video game console, and/or a television set top box.

The term "machine-readable storage medium" or "computer readable medium" as used herein refers to any medium or media that participates in providing instructions to processor 402 for execution. Such a medium may take many forms, including, but not limited to, non-volatile media, volatile media, and transmission media. Non-volatile media include, for example, optical or magnetic disks, such as data storage device 406. Volatile media include dynamic memory, such as memory 404. Transmission media include coaxial cables, copper wire, and fiber optics, including the wires that comprise bus 408. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The subject matter of this specification has been described in terms of particular aspects, but other aspects can be implemented and are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other variations are within the scope of the following claims.

What is claimed is:

1. A computer-implemented method for providing information regarding posts on social networking sites, the method comprising:

receiving, using one or more computing devices, user input associated with linking a content item with a message for posting by a user on a social networking site;

in response to the user input associated with linking the content item with the message, automatically determining, using the one or more computing devices, an identifier for the content item, and automatically identifying, using the one or more computing devices and based on the determined identifier, one or more messages which were previously posted on the social networking site and which include the content item;

determining a number of contacts, associated with the user, that posted the one or more messages;

calculating a ratio of the number of contacts to a total number of contacts associated with the user; and providing for display to the user in connection with a display of the message, using the one or more computing devices, a notification of the one or more messages which were previously posted on the social networking site and which include the content item, the notification comprising names of the contacts associated with the user that posted the one or more messages when the ratio satisfies a threshold ratio that represents a probability of the user identifying the names of the contacts that posted the one or more messages.

2. The computer-implemented method of claim 1, wherein identifying the one or more messages comprises identifying one or more messages which were previously posted by one or more contacts associated with the user and which include the content item.

3. The computer-implemented method of claim 1, wherein identifying the one or more messages comprises identifying one or more messages which were previously posted into activity streams of one or more contacts associated with the user and which include the content item.

4. The computer-implemented method of claim 1, further comprising:

determining that at least one of the one or more previously posted messages are not visible to the user, wherein the provided notification excludes information about the at least one determined message post.

5. The computer-implemented method of claim 1, wherein, if the ratio is less than the threshold ratio, the provided notification includes a numerical value representing the number of contacts, associated with the user, that posted the one or more messages.

6. The computer-implemented method of claim 5, wherein the provided notification excludes information about the one or more previously posted messages if the ratio is greater than the threshold ratio.

7. The computer-implemented method of claim 1, wherein, if the ratio is less than the threshold ratio, the provided notification comprises a numerical value representing a total number of messages including the content item that were previously posted by contacts associated with the user.

8. The computer-implemented method of claim 1, wherein the identifier is a uniform resource locator, and wherein the one or more previously posted messages are obtained by comparing the uniform resource locator with uniform resource locators for content items in messages previously posted on the social networking site.

9. The computer-implemented method of claim 8, wherein the one or more previously posted messages are obtained by comparing a domain of the uniform resource locator with domains of uniform resource locators for content items in messages previously posted on the social networking site.

10. The computer-implemented method of claim 2, wherein the contacts associated with the user comprise contacts in a social graph of the user.

11. The computer-implemented method of claim 10, wherein the contacts associated with the user comprise contacts of contacts in the social graph of the user.

12. The computer-implemented method of claim 1, further comprising:

receiving, after providing the notification for display to the user, a request to post the message containing the content item on the social networking site; and posting the message containing the content item on the social networking site based, at least in part, on receiving the request to post the message containing the content item on the social networking site.

13. The computer-implemented method of claim 1, wherein the identifier is selected by the user.

14. The computer-implemented method of claim 1, wherein the content item is selected by the user.

15. The computer-implemented method of claim 1, wherein the names of the contacts associated with the user in the notification are for users of the social networking site whose content is accessible to the user through the social networking site, and wherein the notification excludes one or more names of one or more users whose content is not accessible to the user through the social networking site.

16. A system for providing a user with notification regarding a post, the system comprising:

one or more processors, and a machine-readable medium comprising instructions stored therein, which when executed by the processors, cause the processors to perform operations comprising:

receiving user input associated with associating a content item with a message for posting by a user on a social networking site;

in response to the user input associated with linking the content item with the message, the one or more computing devices automatically determining an identifier for the content item, and automatically identifying, based on the determined identifier, one or more messages which were previously posted on the social networking site and which include the content item;

determining a number of contacts, associated with the user, that posted the one or more messages;

calculating a ratio of the number of contacts to a total number of contacts associated with the user; and providing for display to the user in connection with a display of the message a notification of the one or more messages which were previously posted on the social networking site and which include the content item, the notification comprising names of the contacts associated with the user that posted the one or more messages when the ratio satisfies a threshold ratio that represents a probability of the user identifying the names of the contacts that posted the one or more messages.

17. The system of claim 16, wherein identifying the one or more messages comprises identifying one or more messages which were previously posted into activity streams of one or more contacts associated with the user and which include the content item.

18. The system of claim 16, further comprising:

determining that at least one of the one or more previously posted messages are not visible to the user, wherein the provided notification excludes information about the at least one determined message post.

19. The system of claim 16, wherein, if the ratio is less than the threshold ratio, the provided notification includes a numerical value representing the number of contacts, associated with the user, that posted the one or more messages.

20. The system of claim 19, wherein the provided notification excludes information about the one or more previously posted messages if the ratio is greater than the threshold ratio.

21. The system of claim 16, wherein the identifier is a uniform resource locator, and wherein the one or more previously posted messages are obtained by comparing the uniform resource locator with uniform resource locators for content items in messages previously posted on the social networking site.

22. The system of claim 17, wherein the contacts associated with the user comprise contacts in a social graph of the user.

23. The system of claim 22, wherein the contacts associated with the user comprise contacts of contacts in the social graph of the user.

24. The system of claim 16, wherein the names of the contacts associated with the user in the notification are for users of the social networking site whose content is accessible to the user through the social networking site, and wherein the notification excludes one or more names of one or more users whose content is not accessible to the user through the social networking site.

25. A non-transitory machine-readable medium, comprising instructions stored therein, which when executed by a processor, cause the processor to perform operations comprising:

receiving user input associated with associating a content item with a message for posting by a user on a social networking site;

in response to the user input associated with linking the content item with the message, the one or more computing devices automatically determining an identifier for the content item, and automatically identifying, based on the determined identifier, one or more messages which were previously posted on the social networking site and which include the content item;

determining a number of contacts, associated with the user, that posted the one or more messages;

calculating a ratio of the number of contacts to a total number of contacts associated with the user; and providing for display to the user in connection with a display of the message a notification of the one or more messages which were previously posted on the social networking site and which include the content item, the notification comprising names of the contacts associated with the user that posted the one or more messages when the ratio satisfies a threshold ratio that represents a probability of the user identifying the names of the contacts that posted the one or more messages.

26. The non-transitory machine-readable medium of claim 25, wherein, if the ratio is less than the threshold ratio, the provided notification includes a numerical value representing the number of contacts, associated with the user, that posted the one or more messages.

27. The non-transitory machine-readable medium of claim 25, wherein identifying the one or more messages comprises identifying one or more messages which were previously posted into activity streams of one or more contacts associated with the user and which include the content item, and wherein the contacts associated with the user comprise contacts in a social graph of the user.

* * * * *